United States Patent [19]
Konishi et al.

[11] Patent Number: 6,145,519
[45] Date of Patent: *Nov. 14, 2000

[54] SEMICONDUCTOR WORKPIECE CLEANING METHOD AND APPARATUS

[75] Inventors: Toko Konishi; Cozy Ban, both of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/857,364

[22] Filed: May 15, 1997

[30] Foreign Application Priority Data

Nov. 11, 1996 [JP] Japan .................................. 8-299097

[51] Int. Cl.$^7$ ....................................................... B08B 7/04
[52] U.S. Cl. ........................ 134/95.2; 134/95.3; 134/902
[58] Field of Search ................................ 134/94.1, 95.2, 134/902, 102.1

[56] References Cited

U.S. PATENT DOCUMENTS

| | | |
|---|---|---|
| 4,300,581 | 11/1981 | Thompson . |
| 4,984,597 | 1/1991 | McConnell et al. .................... 134/95.2 |
| 5,069,236 | 12/1991 | Pierson . |
| 5,090,432 | 2/1992 | Bran ........................ 134/139 |
| 5,217,925 | 6/1993 | Ogawa et al. . |
| 5,443,540 | 8/1995 | Kamikawa ................................ 34/471 |
| 5,468,302 | 11/1995 | Thietje . |
| 5,520,744 | 5/1996 | Fujikawa et al. ........................... 134/11 |
| 5,571,337 | 11/1996 | Mohindra et al. . |
| 5,575,079 | 11/1996 | Yokomizo et al. ........................ 34/78 |
| 5,807,439 | 9/1998 | Akatsu et al. ............................. 134/32 |
| 5,817,185 | 10/1998 | Shindo et al. .......................... 134/25.4 |
| 5,839,456 | 11/1998 | Han ..................... 134/104.1 |

FOREIGN PATENT DOCUMENTS

| | | |
|---|---|---|
| 0 650 775 | 5/1995 | European Pat. Off. . |
| 57-170537 | 10/1982 | Japan . |
| 3-18332 | 3/1991 | Japan . |
| 3-62925 | 3/1991 | Japan . |
| 6-196465 | 7/1994 | Japan . |
| 6-333899 | 12/1994 | Japan . |
| 7-211686 | 8/1995 | Japan . |
| 7-283194 | 10/1995 | Japan . |
| WO 95/08406 | 3/1995 | WIPO . |

OTHER PUBLICATIONS

Patent Abstracts of Japan, vol. 10, No. 352 (E–458), Nov. 27, 1986, JP 61–152020, Jul. 10, 1986.
Patent Abstracts of Japan, vol. 17, No. 188 (E–1349), Apr. 13, 1993, JP 4–336430, Nov. 24,1992.
Patent Abstracts of Japan, JP 6–349803, Dec. 22, 1994.
Patent Abstracts of Japan, vol. 16, No. 108 (E–1179), Mar. 17, 1992, JP 3–283535, Dec. 13,1991.
Derwent Abstracts of Proceedings IEEE, The Ninth Annual International Workshop on Micro Electro Mechanical Systems, AN 96:5316235, M. Ohtsu, et al., "Fabrication of Packaged Thin Beam Structures By An Improved Drying Method", Feb. 11–15, 1996.

*Primary Examiner*—Philip R. Coe
*Attorney, Agent, or Firm*—Oblon, Spivak, McClelland, Maier & Neustadt, P.C.

[57] ABSTRACT

A semiconductor workpiece cleaning apparatus includes a cleaning arrangement that cleans a semiconductor workpiece by use of a cleaning liquid, a charging arrangement that brings into a chamber a drying liquid, and a discharging arrangement that discharges the cleaning liquid. The cleaning arrangement cleans the workpiece by spraying chemical liquid and/or pure water in the chamber, and by immersing the workpiece in the chemical liquid and/or pure water. The charging arrangement takes in the drying chemical liquid or vapor so as to contact the processing chemical liquid or pure water in which the semiconductor workpiece is immersed. The discharging arrangement discharges the processing chemical liquid or pure water while preserving an interface between the processing chemical liquid or pure water and the drying chemical liquid or vapor.

19 Claims, 7 Drawing Sheets

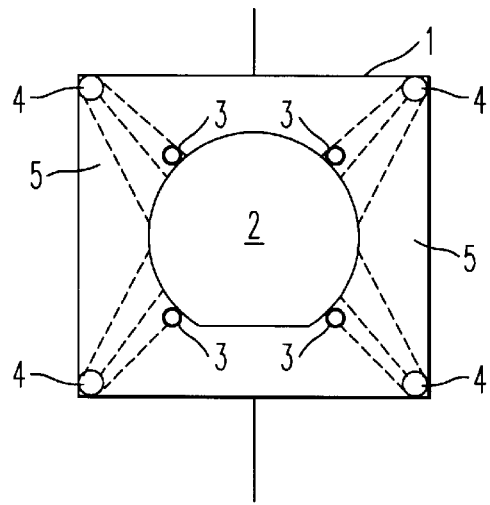
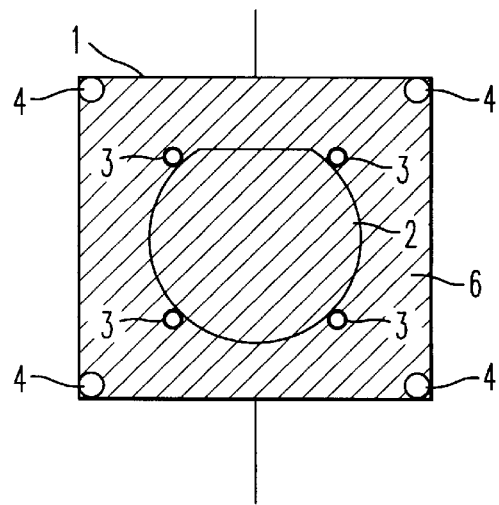
FIG. 4a    FIG. 4b
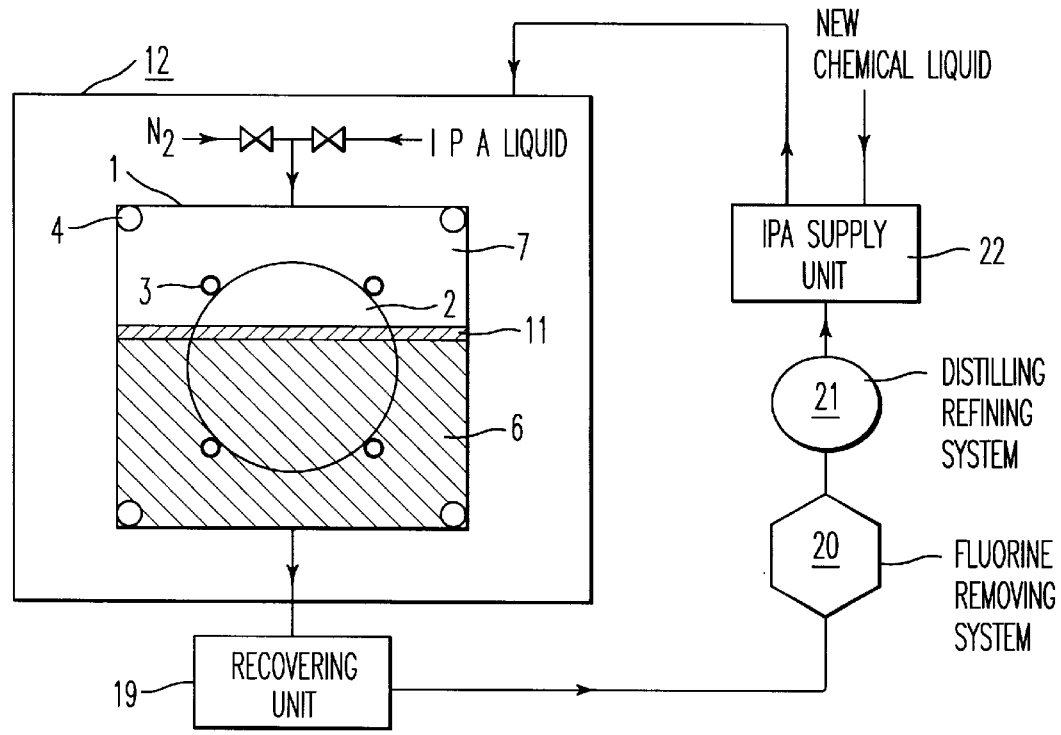
FIG. 4c

SEMICONDUCTOR WORKPIECE CLEANING METHOD AND APPARATUS

BACKGROUND OF THE INVENTION

1. Field of the Invention

The present invention relates to a semiconductor workpiece cleaning method and apparatus and, more particularly, to a semiconductor workpiece cleaning method and apparatus to be adopted by or installed in a semiconductor wafer processing line to clean a semiconductor workpiece.

2. Background of the Invention

A semiconductor workpiece cleaning process in a semiconductor device fabricating process has increased in importance as semiconductor devices include finer structures and features. Recently, a single-tank cleaning apparatus which carries out a plurality of chemical cleaning processes in one tank has often been used to reduce floor space (i.e., footprint) necessary for installing the cleaning apparatus.

Wet semiconductor workpiece cleaning apparatuses are classified roughly into immersion cleaning apparatuses which immerse a workpiece in a chemical liquid for cleaning, and spray cleaning apparatuses which spray a chemical liquid onto the workpiece for cleaning.

A conventional single-tank dip type cleaning apparatus will be described with reference to FIG. 7. In this conventional cleaning apparatus, a workpiece 2 is held fixedly on guide members 3 in a chamber 1 defined by a vessel, and a cleaning chemical liquid or pure water is supplied into the chamber 1 through a lower part of the vessel, and discharged from the chamber 1 through an upper part of the vessel to clean the workpiece 2. Hot pure water and cold pure water are mixed in a line 4a so as to supply pure water of a predetermined temperature at a predetermined flow rate into the chamber 1. The chemical liquid is supplied from a chemical liquid supply unit 4b to the line 4a, so that the chemical liquid can be supplied into the chamber 1 simultaneously with the pure mixed water.

In this cleaning apparatus, pure water contained in the chamber 1 needs to be replaced with the chemical liquid so as to immerse the workpiece 2 in the chemical liquid. Subsequently, the chemical liquid contained in the chamber 1 needs to be replaced with pure water for water-rinsing after the workpiece 2 has been immersed in the chemical liquid. The process of replacing pure water with the chemical liquid and the process of replacing the chemical liquid with pure water lengthening processes. In particular, the water-rinsing process performed after the immersion of the workpiece in the chemical liquid takes considerable time to restore the resistivity of the rinsing water, which, in turn, reduces processing efficiency (i.e., throughput) of the cleaning process.

A conventional single-tank spray type cleaning apparatus will be described with reference to FIG. 8. In this single-tank spray type cleaning apparatus, a workpiece 2 is held by guide members 3 while turned, and a nozzle 4 sprays a cleaning liquid 5 on the workpiece 2 for cleaning. This single-tank spray type cleaning apparatus, as compared with the single-tank dip type cleaning apparatus, can easily be changed from a chemical cleaning process to a water rinsing process, and hence the throughput of the single-tank spray type cleaning apparatus is higher than that of the single-tank dip type cleaning apparatus. However, when the workpiece is rotated to spin-dry the workpiece after the last rinsing process, water marks, i.e., stains, are formed on the surfaces of the workpiece. Water marks formed on the workpiece adversely affect the characteristics of a device fabricated by processing the workpiece, and reduce the yield of the device production system remarkably. Thus, as determined by the present inventors, formation of water marks on the workpiece is a problem in the spray type cleaning apparatus.

There are no single-tank cleaning apparatuses provided with both a single tank in which a plurality of chemical liquids are used for cleaning, and capable of cleaning workpieces at a high throughput and without forming water marks thereon.

As mentioned above, the conventional semiconductor workpiece cleaning apparatuses require much time for cleaning, are inefficient, and form water marks on the workpieces during drying after cleaning.

SUMMARY OF THE INVENTION

Accordingly, the objects of the present invention are to solve the above problems, and to provide a semiconductor workpiece cleaning method and apparatus capable of efficiently cleaning semiconductor workpieces, and capable of preventing the formation of water marks on the semiconductor workpieces.

Accordingly, one aspect of the present invention, is to provide a semiconductor workpiece cleaning apparatus that includes a cleaning arrangement the cleans a semiconductor workpiece by use of a chemical liquid or pure water, a charging arrangement for bringing in a drying chemical liquid, and a discharging arrangement for discharging the cleaning liquid. The cleaning device cleans the workpiece by spraying a processing chemical liquid and/or pure water in a chamber, and/or by immersing the workpiece in the processing chemical liquid and/or pure water. The charging arrangement takes in the drying chemical liquid or vapor so as to be in into contact with and create an interface between drying chemical liquid and the processing chemical liquid or pure water in which the semiconductor workpiece is immersed. The discharging arrangement discharges the processing chemical liquid or pure water while preserving the interface layer during discharge.

In another aspect of the present invention, in the semiconductor workpiece cleaning apparatus, the processing chemical liquid and/or pure water is sprayed to clean the semiconductor workpiece, and then other processing chemical liquid is supplied into the chamber to immerse the semiconductor workpiece.

In another aspect of the present invention, in the semiconductor workpiece cleaning apparatus, the processing chemical liquid or pure water is supplied into and discharged from the chamber through a lower part of the chamber.

In another aspect of the present invention, in the semiconductor workpiece cleaning apparatus, the semiconductor workpiece is inverted when the lower half of the semiconductor workpiece is immersed in the processing chemical liquid while the processing chemical liquid is being supplied into the chamber. Then, the processing chemical liquid is further supplied into the chamber.

In another aspect of the present invention, in the semiconductor workpiece cleaning apparatus, the drying chemical liquid is supplied through an upper part of the chamber, and the drying chemical liquid forms a boundary layer which separates an upper gas phase from a lower liquid phase when the drying chemical liquid comes into contact with or dissolves in the processing chemical liquid or pure water.

In another aspect of the present invention, in the semiconductor workpiece cleaning apparatus, the drying chemical vapor is supplied through an upper part of the chamber so that the drying chemical vapor dissolves or condenses in a surface layer of the processing chemical liquid or pure water to form a blocking boundary layer in the processing chemical liquid or pure water. Preferably, the thickness of the blocking boundary layer is greater than the wave height of surface waves of the processing chemical liquid or the pure water. Further, preferably the thickness of the blocking boundary layer is 2 mm or more.

In another aspect of the present invention, in the semiconductor workpiece cleaning apparatus, the drying chemical liquid is supplied into the chamber through a lower part of the chamber to replace the processing chemical liquid or pure water in which the semiconductor workpiece is immersed with the drying chemical liquid.

In another aspect of the present invention, in the semiconductor workpiece cleaning apparatus, the processing chemical liquid is selected from a group of mixed liquid prepared by mixing ammonia, hydrogen peroxide and water; hydrochloric acid, hydrogen peroxide and water; sulfuric acid, hydrogen peroxide and water; hydrofluoric acid and water; hydrofluoric acid, hydrogen peroxide and water; hydrofluoric acid, ammonium fluoride and water (buffered hydrofluoric acid); ozone and water; or electrolytic ionic water.

In another aspect of the present invention, in the semiconductor workpiece cleaning apparatus, the processing chemical liquid is selected from a group of mixed liquid prepared by mixing hydrofluoric acid and water; hydrofluoric acid, hydrogen peroxide and water; or hydrofluoric acid, ammonium fluoride and water (buffered hydrofluoric acid), and the processing chemical liquid is used for oxide film removal.

In another aspect of the present invention, in the semiconductor workpiece cleaning apparatus, the drying chemical liquid is isopropyl alcohol or the product "FLUORINERT", which is a registered trademark for an inert liquid of the fluorine group owned by 3M Company.

In another aspect of the present invention, in the semiconductor workpiece cleaning apparatus, the chamber is provided with at least one nozzle for spraying the processing chemical liquid or pure water.

In another aspect of the present invention, in the semiconductor workpiece cleaning apparatus, the spraying direction of the nozzle, or nozzles, is varied while spraying the processing chemical liquid or pure water.

In another aspect of the present invention, in the semiconductor workpiece cleaning apparatus, the semiconductor workpiece held within the chamber is turned while the processing chemical liquid or the pure water is sprayed.

In another aspect of the present invention, in the semiconductor workpiece cleaning apparatus, different processing chemical liquids or water are/is sprayed on the workpiece sequentially through the nozzle, or nozzles, within the chamber.

In another aspect of the present invention, the semiconductor workpiece cleaning apparatus further includes an arrangement for heating the processing chemical liquid or pure water to be supplied into the chamber at a predetermined temperature, or an arrangement for regulating the concentration of the processing chemical liquid.

In another aspect of the present invention, the semiconductor workpiece cleaning apparatus further includes a temperature regulating arrangement for regulating the temperature of an interior of the chamber.

In another aspect of the present invention, the semiconductor workpiece cleaning apparatus further includes a returning arrangement for recovering the processing chemical liquid discharged from the chamber and returning the same into the chamber.

In another aspect of the present invention, the semiconductor workpiece cleaning apparatus further including a megasonic oscillation arrangement attached to the chamber.

In another aspect of the present invention, in the semiconductor workpiece cleaning apparatus, the megasonic oscillation arrangement is disposed at a selected portion of the chamber, and the semiconductor workpiece is turned so that a megasonic effect is exerted on the entire semiconductor workpiece.

According to another aspect of the present invention, a semiconductor workpiece cleaning method is characterized in the way as performed in each of the above cleaning apparatuses.

In another aspect of the present invention, the semiconductor workpiece cleaning method is performed by using either one of the cleaning apparatuses as explained above.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4(a), 4(b) and 4(c) are conceptional views of a semiconductor workpiece cleaning apparatus and method in a fourth embodiment according to the present invention.

DETAILED DESCRIPTION OF THE PREFERRED EMBODIMENTS

Figure 1A:
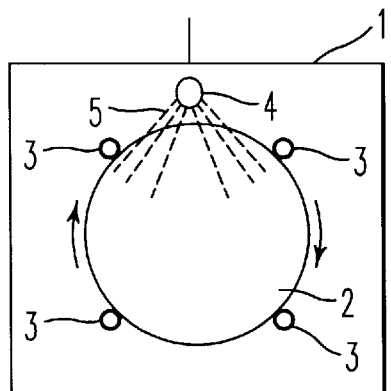
FIGS. 1(a), 1(b) and 1(c) are conceptional views of a semiconductor workpiece cleaning apparatus and method in a first embodiment according to the present invention.

Referring now to the drawings, wherein like reference numerals designate identical or corresponding parts throughout the several views, first through sixth embodiments of the present invention are next described.
First Embodiment FIGS. 1(a), 1(b) and 1(c) are conceptional views of a semiconductor workpiece cleaning method and apparatus in a first embodiment according to the present invention.

Shown in FIG. 1(a), is a casetteless semiconductor workpiece cleaning apparatus, which holds a semiconductor wafer 2, i.e., a semiconductor workpiece to be cleaned, in a vertical position by guide members 3, rotates the semiconductor wafer 2 in a chamber 1, and sprays a cleaning liquid or pure water 5 on the semiconductor wafer 2 by a nozzle 4 so as to clean the semiconductor wafer 2. The guide members 3 are configured to rotate so as to rotate the wafer 2. As shown, a first processing chemical liquid (first cleaning liquid) prepared by mixing sulfuric acid, hydrogen peroxide and water is sprayed by the nozzle 4 on the wafer 2 to remove organic substances and the like from the wafer 2. This first cleaning step is followed by a finishing step where pure water is sprayed on the wafer 2 for rinsing. Then, a second cleaning liquid prepared by mixing ammonia, hydrogen peroxide and water is sprayed in a second cleaning step on the wafer 2 to remove particles, and followed by another rinsing step where pure water is sprayed on the wafer 2 for rinsing. Then, a third cleaning liquid prepared by mixing hydrochloric acid, hydrogen peroxide and water is sprayed in a third cleaning step on the wafer 2 to remove metallic contaminants and then pure water is sprayed on the wafer 2 for rinsing the wafer 2.

Figure 1B:
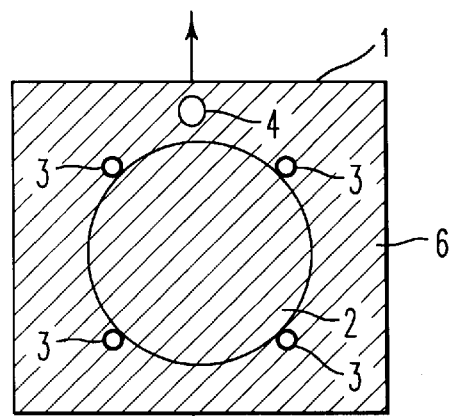

Then, as shown in FIG. 1(b), a hydrofluoric acid solution 6, i.e., a processing chemical liquid, is supplied through a lower part of the chamber 1 into the chamber 1 (as shown by a line with an arrow) to fill up the chamber 1 with the hydrofluoric acid solution for final cleaning to remove an oxide film being formed by natural oxidation. Subsequently, pure water 9 is supplied through the lower part of the chamber 1 into the chamber 1 to replace the hydrofluoric acid solution for rinsing. After the chamber 1 has been filled up with the pure water 9, a drying process is started as discussed below.

Figure 1C:
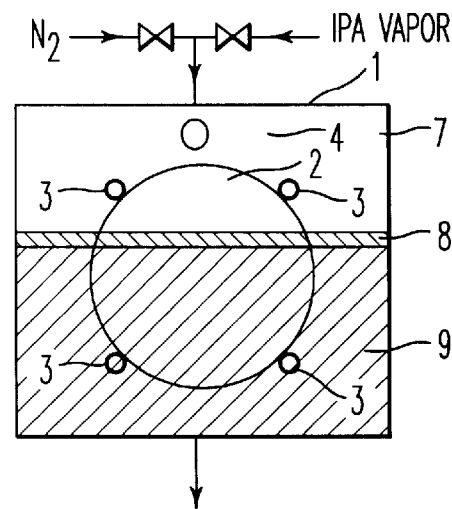

As shown in FIG. 1(c), an isopropyl alcohol vapor (IPA vapor) 7, i.e., a drying chemical vapor, is supplied, for drying the wafer 2, through an upper part of the chamber 1 into the chamber 1 filled up with the pure water 9. The IPA vapor 7 supplied into an upper portion of the chamber 1 comes into contact with the pure water 9, the IPA vapor 7 dissolves in the pure water 9 or condenses and an IPA/pure water boundary layer 8 is formed. The boundary layer 8 separates the pure water 9 from a gas phase, i.e., the IPA vapor 7, prevailing over the boundary layer 8. Consequently, the pure water 9 is isolated from the ambient gas (ambient air, ambient atmosphere or the atmosphere).

While the IPA vapor 7 is supplied through the upper part of the chamber 1 into the chamber 1, the pure water 9 is drained through a lower part of the chamber 1 at a rate which enables the maintenance of the boundary layer 8. After the pure water 9 has completely been drained from the chamber 1, nitrogen gas (N2) is supplied through an upper part of the chamber 1 into the chamber 1 to purge the chamber 1 of the IPA vapor. Thus, the gas (ambient air, ambient atmosphere or the atmosphere) and the liquid (pure water) can perfectly be separated from each other during drying, so that the wafer 2 can be cleaned and dried without forming any water mark thereon.

Workpieces to be cleaned by the semiconductor workpiece cleaning apparatus include semiconductor wafers, masks and the like.

Figure 8:
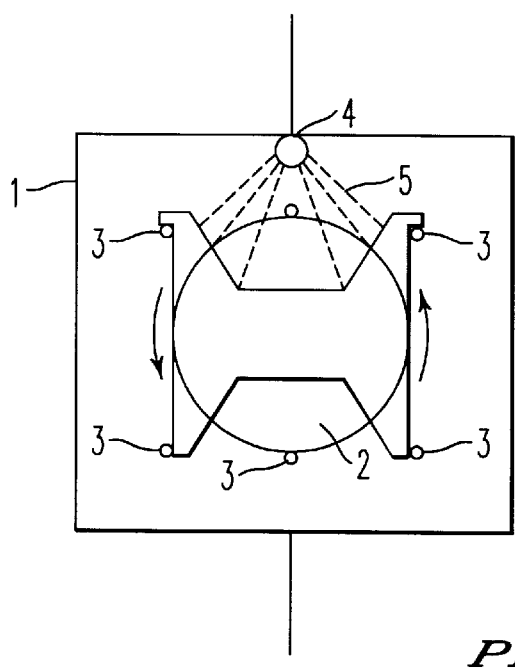
FIG. 8 is a conceptional view of a conventional single-tank spray type cleaning apparatus.

The semiconductor workpiece may be held in a cassetteless mode as shown in FIGS. 1(a) to 1(c) or in a cassette mode as shown in FIG. 8.

Liquid-phase IPA may be used instead of vapor-phase IPA as a drying chemical liquid.

The processing (cleaning) chemical liquid include one or a plurality of a mixture of ammonia, hydrogen peroxide and water, a mixture of hydrochloric acid, hydrogen peroxide and water, and a mixture of sulfuric acid, hydrogen peroxide and water, a mixture of hydrofluoric acid and water, a mixture of hydrofluoric acid, hydrogen peroxide and water, a mixture of hydrofluoric acid, ammonium fluoride and water (buffered hydrofluoric acid), a mixture of ozone and water, and electrolytic ionic water.

The processing chemical liquid for removing oxide films after cleaning is a mixture of hydrofluoric acid and water, a mixture of hydrofluoric acid, hydrogen peroxide and water, or a mixture of hydrofluoric acid, ammonium fluoride and water (buffered hydrofluoric acid).

The drying chemical is liquid-phase or gas-phase isopropyl alcohol, florinat (C8F18, C4F9, C4F7O).

The chamber 1 may be provided with one or a plurality of nozzles at one or a plurality of positions to spray the chemical liquid and pure water.

It is preferable for effective cleaning to hold the semiconductor workpiece 2 stationary and to reciprocate and turn the nozzle 4 to spray the chemical liquid from different directions on the semiconductor workpiece 2.

The semiconductor workpiece 2 may be held in a vertical or nearly vertical position, and the chemical liquid may be sprayed on the semiconductor workpiece 2 while the semiconductor workpiece 2 is rotated.

Generally, different processing liquids are sprayed sequentially from the nozzle 4 to remove different kinds of foreign matters adhering to the semiconductor workpiece 4.

As is apparent from the foregoing description, the cleaning apparatus and the cleaning method cleans the semiconductor workpiece efficiently in the process without forming any water marks on the semiconductor workpiece.

Second Embodiment

FIGS. 2(a), 2(b), 2(c) and 2(d) are conceptional views for explaining a semiconductor workpiece cleaning method and apparatus in a second embodiment according to the present invention.

Figure 2B:
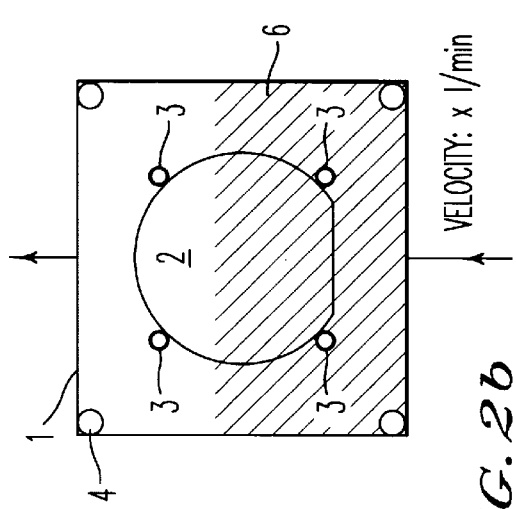
FIGS. 2(a), 2(b), 2(c) and 2(d) are conceptional views of a semiconductor workpiece cleaning apparatus and method in a second embodiment according to the present invention.
Figure 2D:
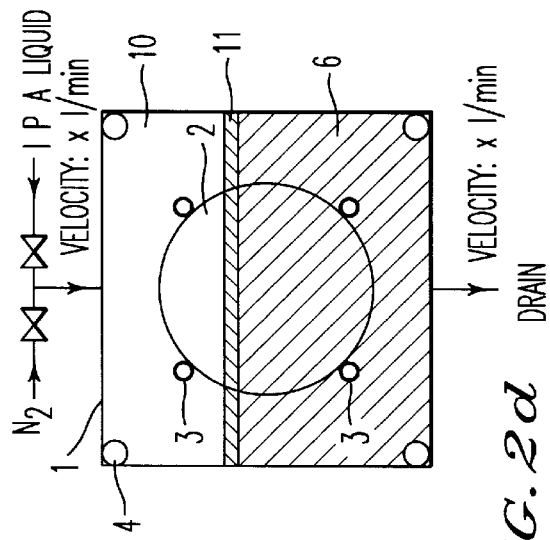
Figure 2A:
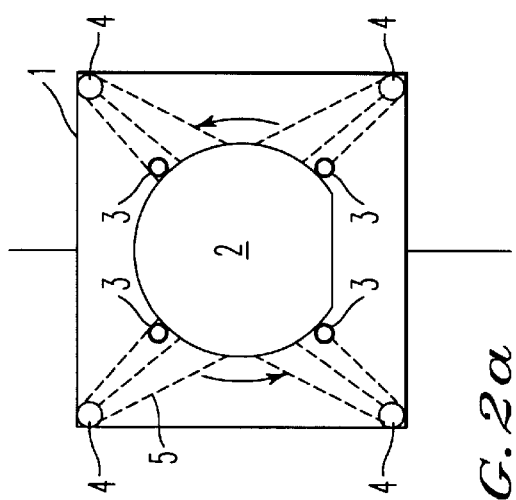

As shown in FIG. 2(a), the semiconductor workpiece cleaning apparatus holds a semiconductor wafer 2, i.e., a semiconductor workpiece to be cleaned, in a vertical position by guide members 3, rotates the semiconductor wafer 2 in a chamber 1, and sprays a cleaning liquid or pure water 5 on the semiconductor wafer 2 by nozzles 4 disposed at a plurality of positions within the chamber 1 to clean the semiconductor wafer 2. The guide members 3 are rotated to rotate the wafer 2, a first processing chemical liquid (first cleaning liquid) prepared by mixing sulfuric acid, hydrogen peroxide and water is sprayed in a first cleaning step by the nozzles 4 on the wafer 2 to remove organic substances and the like from the wafer 2. Then, pure water is sprayed in a rinsing step on the wafer 2 for rinsing. Then, a second cleaning liquid prepared by mixing ammonia, hydrogen peroxide and water is sprayed in a second cleaning step on the wafer 2 to remove particles, and then pure water is sprayed in a rinsing step on the wafer 2 for rinsing. Then, a third cleaning liquid prepared by mixing hydrochloric acid, hydrogen peroxide and water is sprayed in a third cleaning step on the wafer 2 to remove metallic contaminants and pure water is sprayed for rinsing. Because the semiconductor workpiece cleaning apparatus is provided with the plurality of nozzles 4, the time necessary for cleaning the semiconductor workpiece can be curtailed, and semiconductor workpiece cleaning apparatus operates at a high efficiency (throughput).

Figure 2C:
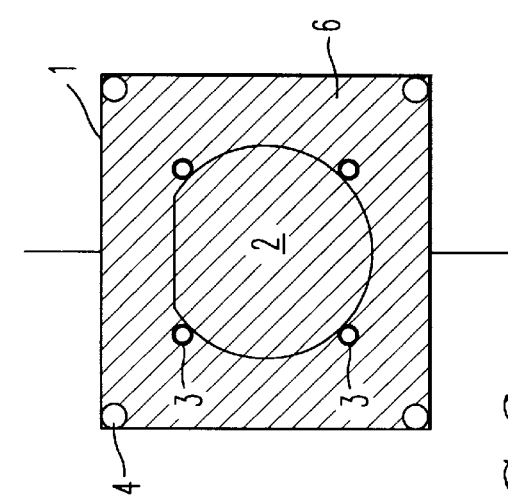

After the spray-cleaning process has been completed, a hydrofluoric acid solution 6 (second processing liquid) is supplied through a lower part of the chamber 1 into the chamber at a predetermined supply rate of a velocity of x 1/min as shown in FIG. 2(b) for final cleaning. After the chamber 1 is filled half full, the guide members 3 are rotated to invert the semiconductor wafer 2 as shown in FIG. 2(c), and the hydrofluoric acid solution 6 is supplied at the supply rate of a velocity of x 1/min through the lower part of the chamber 1 to fill up the chamber 1.

After the semiconductor wafer 2 has been immersed in the hydrofluoric acid solution 6 for a predetermined immersing time, the hydrofluoric acid solution 6 is drained from the chamber 1 through the lower part of the chamber 1 at a drain rate of a velocity of x 1/min, which is equal to the supply rate, and liquid-phase isopropyl alcohol (IPA) 10, i.e., a drying chemical liquid, is supplied through an upper part of the chamber 1 into the chamber 1. Part of the liquid-phase IPA 10 in contact with the surface of the hydrofluoric acid solution 6 dissolves in the hydrofluoric acid solution 6, and a boundary layer 11 of hydrofluoric acid solution and IPA is formed (see FIG. 2d). The supply of the liquid-phase IPA is stopped after the thickness of the boundary layer 11 has increased 2 mm or more, and then the hydrofluoric acid solution 6 is drained through a lower part of the chamber 1 at a predetermined drain rate of a velocity of x 1/min.

Nitrogen gas (N2) is supplied through an upper part of the chamber 1 into the chamber 1 at a supply rate which will not change the thickness of the boundary layer 11 of hydrofluoric acid solution and IPA, while the hydrofluoric acid solution 6 is being drained. After the liquid has completely been drained from the chamber 1, the chamber 1 is purged with nitrogen gas (N2). Thus, the hydrofluoric acid solution 6, i.e., the processing chemical liquid, is separated from the drying chemical liquid, i.e., IPA, by the boundary layer 11 to separate the processing chemical liquid from the gas-phase layer, i.e., the nitrogen layer. Consequently, hydrofluoric acid solution 6, i.e., the processing chemical liquid, can perfectly be separated from the gas (ambient air, ambient atmosphere or the atmosphere) during drying, so that the semiconductor wafer 2 can be cleaned without forming any water mark thereon.

In this embodiment, the boundary layer 11 for separating the processing chemical liquid and the drying chemical liquid from each other is formed in a thickness not less than 2 mm. The thickness of the boundary layer 11 for separating the gas (ambient air, ambient atmosphere or the atmosphere) from water or the cleaning chemical liquid is greater than the height of waves generated by the disturbance of the liquid surface so that the boundary layer 11 may not be broken.

In this embodiment, the semiconductor wafer 2 is rotated to immerse the entire surfaces of the semiconductor wafer 2 evenly in the processing chemical liquid, and hence oxide films formed by natural oxidation on the surfaces of the semiconductor wafer 2 can evenly be removed by etching.

When supplying the drying chemical liquid into the chamber in which the semiconductor workpiece is immersed in the processing chemical liquid or pure water, the drying chemical liquid is supplied through an upper part of the chamber into the chamber if the specific gravity of the drying chemical liquid is smaller than the processing chemical liquid to replace the cleaning liquid or the pure water contained in the chamber with the drying chemical liquid. If the specific gravity of the drying chemical liquid is greater than that of the processing chemical liquid contained in the chamber, the drying chemical liquid is supplied through a lower part of the chamber into the chamber to replace the processing chemical liquid with the drying chemical liquid. The drying chemical liquid is isopropyl alcohol or florinat (C8F18, C4F9, C4F7O).

Third Embodiment

Figure 3:
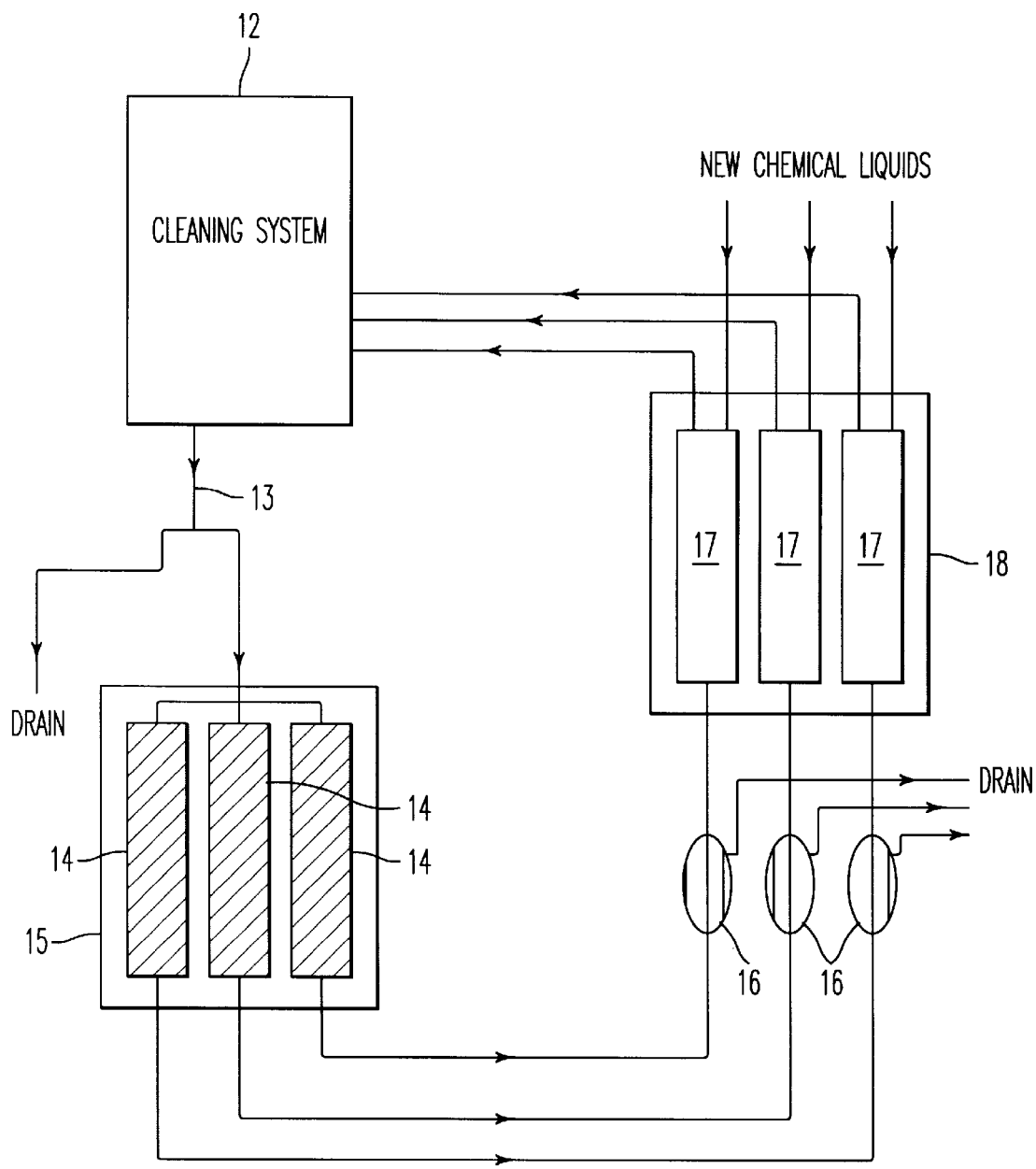
FIG. 3 is a block diagram system view of a semiconductor workpiece cleaning apparatus in a third embodiment according to the present invention.

FIG. 3 is a conceptional view of a semiconductor workpiece cleaning apparatus in a third embodiment according to the present invention and is used to describe the apparatus and method of this embodiment.

This semiconductor workpiece cleaning apparatus comprises a cleaning system similar to those of the first and the second embodiment, and a chemical liquid recycling system for recovering the used cleaning chemical liquid, refining the recovered cleaning chemical liquid and re-using the refined cleaning chemical liquid.

A cleaning system 12 sprays a processing chemical liquid on a workpiece, and then the contaminated processing chemical liquid that is contaminated with foreign matter washed from the workpiece is discharged through a discharge line 13 and into a waste liquid recovering unit 15 which has waste liquid tanks 14 for housing different processing chemical liquids. The waste liquid recovering unit 15 stores the different waste chemical liquids separately in the waste liquid tanks 14, respectively. The recovered waste chemical liquids are refined by refining units 16. Residue remaining in the refining units 16 after refining the waste chemical liquids are discharged from the refining units 16 via a drain. The refined chemical liquids are sent to and stored in chemical liquid tanks 17 of a chemical liquid supply unit 18. New chemical liquids can be supplied to the chemical liquid tanks 17 to supplement the recycled chemical liquids. When the quantity of the chemical liquid contained in each chemical liquid tank 17 decreases below a predetermined quantity, the chemical liquid tank 17 is replenished with the new chemical liquid.

As is apparent from the foregoing description, in the cleaning system 12 of the semiconductor workpiece cleaning apparatus similar to those of the first and the second embodiment, the used chemical liquid is discharged from the cleaning system 12 through the discharge line 13, the used chemical liquid is recovered and refined, and then the refined chemical liquid is stored in the chemical liquid supply tank 17 of the chemical liquid supply unit 18 to use the recovered chemical liquid again.

Since the processing chemical liquid used for cleaning can be reused, the cleaning cost is reduced. The reduction of the waste chemical liquid is advantageous with respect to environmental protection concerns.

Fourth Embodiment

FIGS. 4(a), 4(b) and 4(c) are conceptional views for explaining a semiconductor workpiece cleaning method and apparatus in a fourth embodiment according to the present invention.

This semiconductor workpiece cleaning apparatus is provided with a cleaning system 12 similar to those of the first and the second embodiment, and capable of recovering and reusing a used drying chemical liquid.

Referring to FIG. 4(a), a semiconductor wafer 2, i.e., a semiconductor workpiece, is held in a vertical position by guide members 3 in a chamber 1, a processing chemical liquid, i.e., cleaning liquid, or pure water 5 is sprayed from nozzles 4 on the semiconductor wafer 2 to clean the semiconductor wafer 2 while the semiconductor wafer 2 is rotated. Then, as shown in FIG. 4(b), a hydrofluoric acid solution 6, i.e., a processing chemical liquid for final cleaning, is supplied through a lower part of the chamber 1 into the chamber 1 at a predetermined supply rate of a velocity x 1/min. After the semiconductor wafer 2 has been immersed in the hydrofluoric acid solution 6 for a predetermined time, vapor-phase IPA 7, i.e., drying chemical vapor, is supplied through an upper part of the chamber 1 into the chamber 1.

Then as shown in FIG. 4(c), part of the vapor-phase IPA 7 that is in contact with the surface of the hydrofluoric acid solution 6 dissolves in the hydrofluoric acid solution 6 or condenses on the surface of the hydrofluoric acid solution 6, and a boundary layer 11 of the hydrofluoric acid solution and IPA is formed. Once the increase of the thickness of the boundary layer 11 is not less than 2 mm, the hydrofluoric acid solution 6 is discharged from a lower part of the chamber 1 at a discharge rate equal to the supply rate of a velocity x 1/min, and the vapor-phase IPA is supplied at a supply rate which will not change the thickness of the boundary layer 11 of the hydrofluoric acid solution and IPA.

While the vapor-phase IPA is supplied into the chamber 1 to dry the semiconductor wafer 2 and to replace the processing chemical liquid, the mixture of the hydrofluoric acid solution and IPA is drained from the cleaning system 12. The drained mixture of the hydrofluoric acid solution and IPA is recovered by a recovering unit 19, and then the recovered mixture is sent to a fluorine (F) removing system 20. The fluorine removing system 20 has, for example, a fluorine removing vessel packed with an ion exchange resin. When a liquid containing fluorine is passed through the fluorine removing vessel, fluorine contained in the liquid is removed. The waste liquid is sent to a distilling refining system 21 after fluorine has been removed therefrom, and IPA is recovered and sent to an IPA supply unit 22. New IPA can be supplied to the IPA supply unit 22. If the quantity of IPA contained in the IPA supply unit 22 decreases below a predetermined quantity, the IPA supply unit 22 is replenished with new IPA When the semiconductor workpiece 2 is dried by direct replacement drying in the cleaning system 12 of the semiconductor workpiece cleaning apparatus in the fourth embodiment similar to those of the first and the second embodiment, fluorine is removed selectively from the drying chemical liquid, i.e., a mixture of IPA and other substances, and the thus used drying chemical liquid is recovered, refined and used again.

Since the drying chemical liquid, i.e., IPA, used for direct replacement drying is recycled, the cost is reduced. The reduction of the waste liquid is advantageous in respect of environmental protection concerns.

Fifth Embodiment

Figure 5:
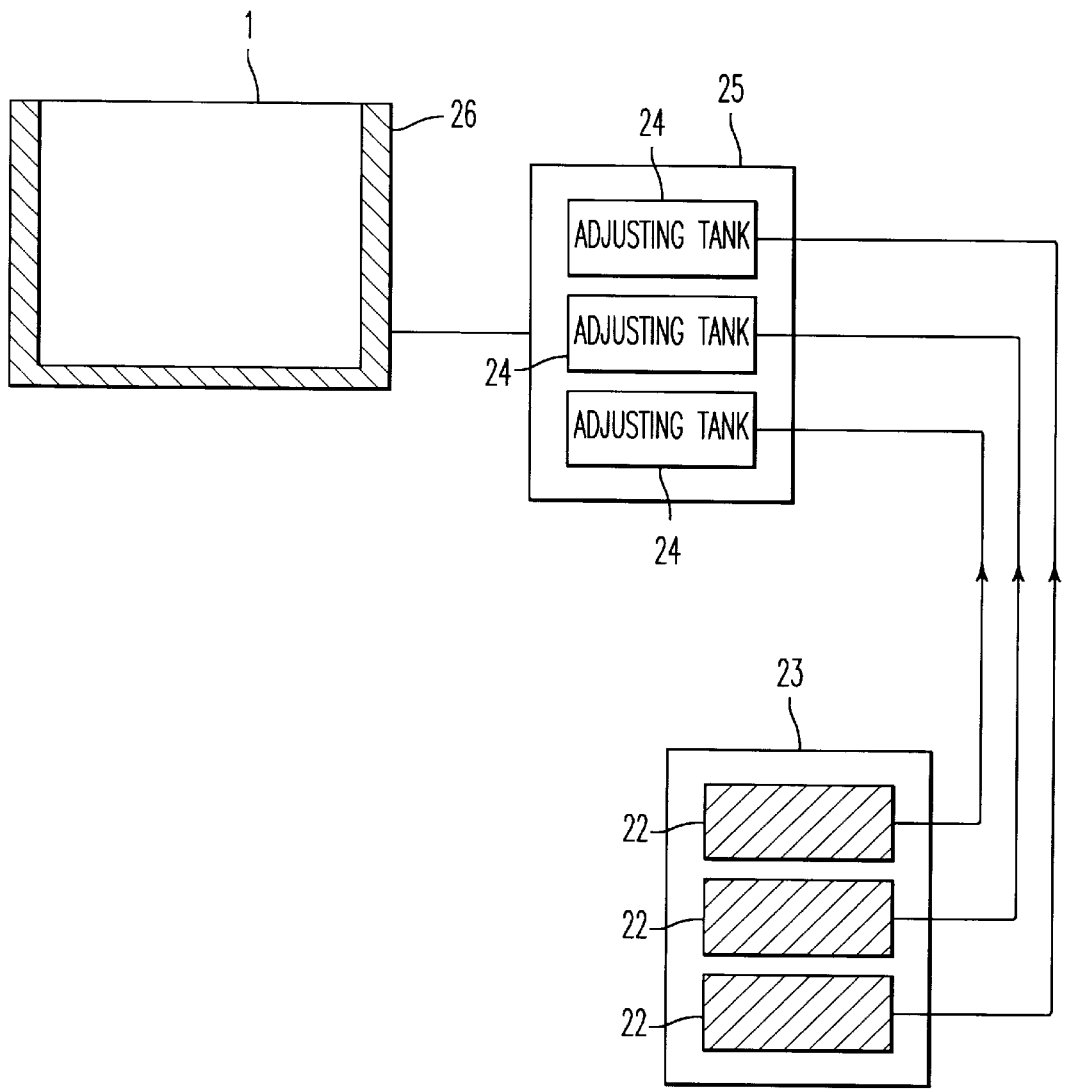
FIG. 5 is a block diagram system view of a semiconductor workpiece cleaning apparatus in a fifth embodiment according to the present invention.

FIG. 5 is a block diagram system that is useful for explaining a semiconductor workpiece cleaning method and apparatus in a fifth embodiment according to the present invention.

This semiconductor workpiece cleaning apparatus is provided with a chemical liquid quality control device for adjusting the temperature and the concentration of a chemical liquid to be supplied into a chamber to a desired temperature and a desired concentration.

As shown in FIG. 5, a chemical liquid supply unit 23 has chemical liquid supply tanks 22 respectively containing processing chemical liquids, i.e., cleaning chemical liquids. A chemical liquid preparing unit 25 has adjusting tanks 24 capable of adjusting the concentrations and temperatures of the cleaning chemical liquids. The chemical liquid preparing unit 25 adjusts the temperatures and the concentrations of the chemical liquids to desired temperatures and desired concentrations, respectively.

The cleaning chemical liquid of a temperature and a concentration adjusted by the chemical liquid preparing unit 25 is supplied into a chamber 1 for cleaning a semiconductor workpiece. The chamber 1 is provided with a temperature regulating device 26 including a heater, a water-cooling device and an electronic refrigerator to regulate the temperature of the cleaning chemical liquid. Therefore, the temperature of the cleaning chemical liquid can very accurately be regulated, which enhances cleaning efficiency and enables the accurate control of etching rate.

This semiconductor workpiece cleaning apparatus in the fifth embodiment is provided with the devices for adjusting the temperature and the concentration of the chemical liquids to desired temperatures and desired concentration in the chemical liquid supply line through which the chemical liquids are supplied into the chamber 1. Since the chamber 1 of the semiconductor workpiece cleaning apparatus is provided with a temperature regulating device, cleaning effect and uniformity of etching can be improved.

Sixth Embodiment

Figure 6A:
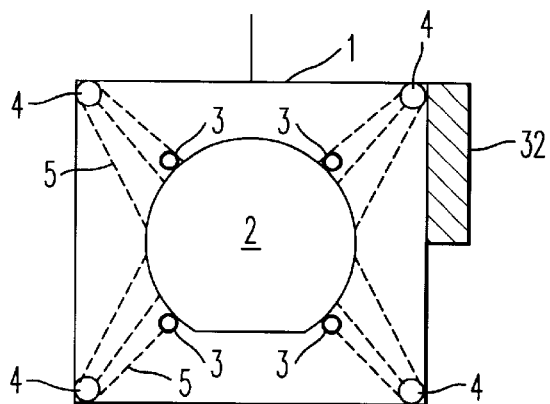
FIGS. 6(a) and 6(b) are conceptional views of a semiconductor workpiece cleaning apparatus and method in a sixth embodiment according to the present invention.
Figure 6B:
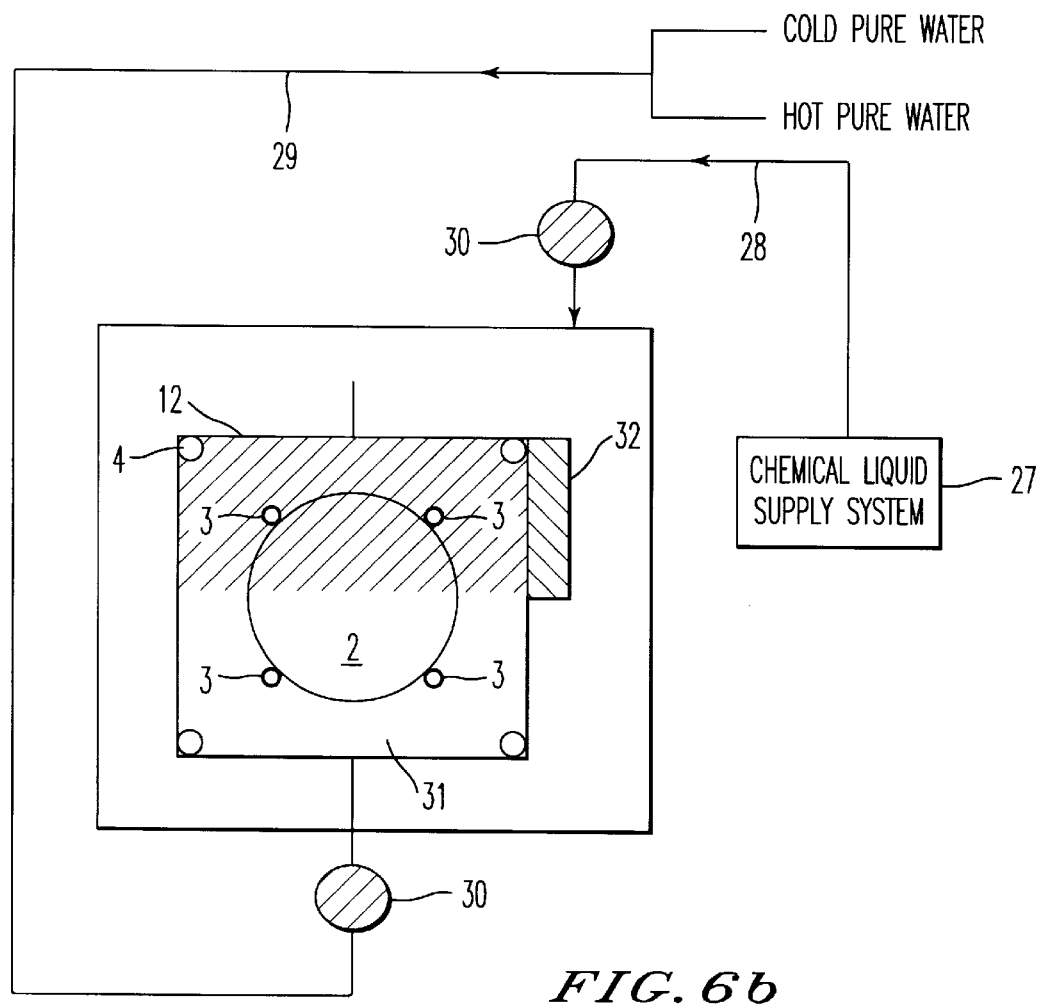
Figure 7:
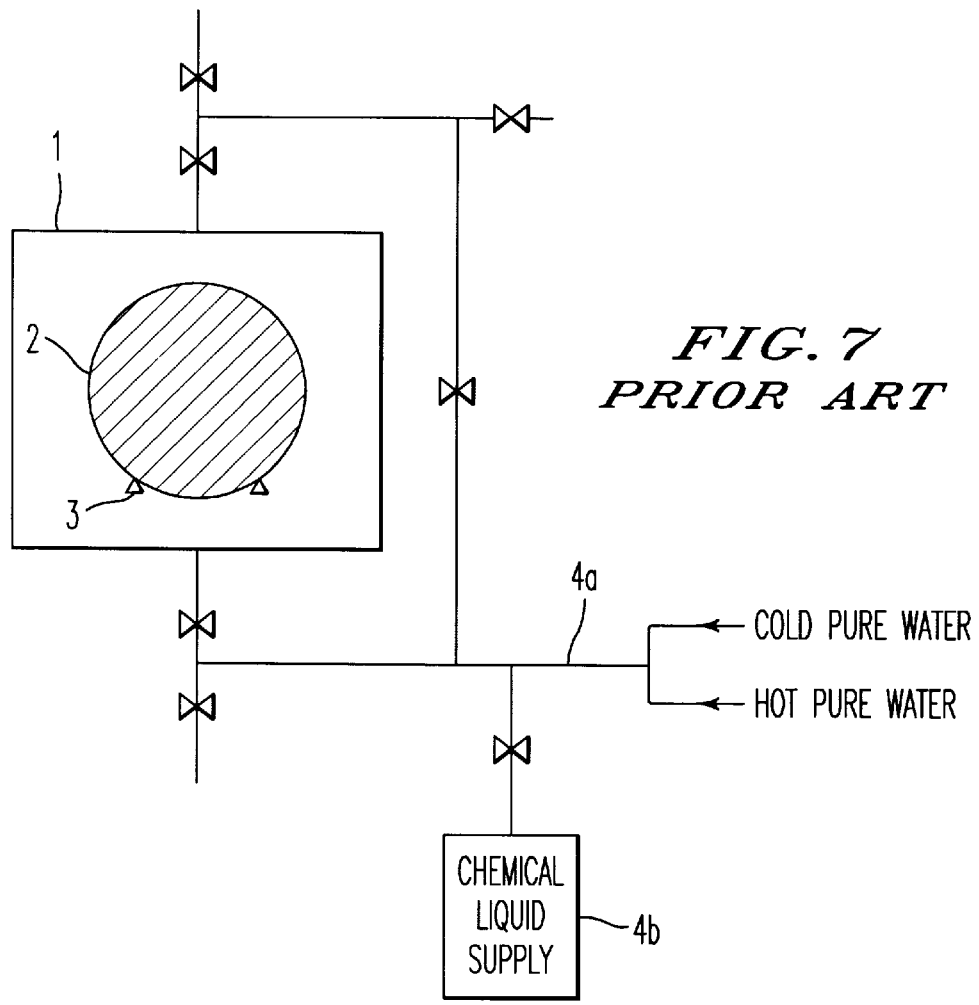
FIG. 7 is a conceptional view of a conventional single-tank dip type cleaning apparatus.

FIGS. 6(*a*) and 6(*b*) are conceptional views for explaining a semiconductor workpiece cleaning method and apparatus in a sixth embodiment according to the present invention.

This semiconductor workpiece cleaning apparatus is provided with temperature controllers 30 in a chemical liquid supply line 28 and a pure water supply line 29 at positions close to a chamber 1, respectively. The chamber 1 is provided with a megasonic oscillation plate 32 attached thereto.

As shown in FIG. 6(*a*), a semiconductor wafer 2, i.e., semiconductor workpiece, is held in the chamber 1 by guide members 3 in a vertical position and rotated, while a processing chemical liquid (cleaning liquid) or pure water 5 is sprayed on the semiconductor wafer 2 by nozzles 4 to clean the semiconductor wafer 2.

As shown in FIG. 6(*b*), a chemical liquid supply system 27 regulates the temperature and the concentration of the cleaning liquid, and supplies the cleaning liquid through the chemical liquid supply line 28 into the chamber 1. Pure water of a desired temperature is prepared by mixing hot pure water and cold pure water, and pure water is supplied through the pure water supply line 29 into the chamber 1. The respective temperatures of the chemical liquid and the pure water changes while the chemical liquid and the pure water are flowing through the supply lines 28 and 29, respectively. Therefore, the temperature regulators 30 are disposed in the chemical liquid supply line 28 and the pure water supply line 29 at positions immediately before the chamber 1 for the accurate temperature control of the chemical liquid and the pure water to ensure high cleaning effect.

After the semiconductor wafer 2 has been cleaned, the chamber 1 is filled up with pure water 31. The megasonic plate 32 provided on the chamber 1 is driven so as to oscillate and thus remove particles adhering to the semiconductor wafer 2. The effective area of the megasonic plate is half the area of the walls of the chamber 1. During megasonic cleaning operation, the guide members 3 are rotated to rotate the semiconductor wafer 2. Therefore, a megasonic effect can be exerted uniformly on the semiconductor wafer 2 even though the effective area of the megasonic plate is half the area of the walls of the chamber 1.

As is apparent from the foregoing description, the semiconductor workpiece cleaning apparatus in the sixth embodiment is provided with the temperature controllers in the chemical liquid supply line from the chemical liquid supply system 27 and in the pure water supply line at positions near the chamber 1. Therefore, the temperatures of the chemical liquid and the pure water can accurately be controlled to enhance the cleaning effect. The semiconductor workpiece cleaning apparatus is provided with the megasonic plate 32 for megasonic cleaning to achieve high cleaning effect.

As is apparent from the foregoing description, according to the present invention, spray type cleaning operation and dip type cleaning operation are used in combination for cleaning a semiconductor workpiece quickly and efficiently.

Since the processing chemical liquid or pure water is isolated by a boundary layer from the vapor of the drying chemical liquid when discharging the cleaning chemical liquid or pure water before drying, the semiconductor workpiece can be cleaned without being stained with water marks.

According to the present invention, the semiconductor workpiece is inverted when the lower half of the semiconductor workpiece is immersed in the processing chemical liquid supplied through a lower part of the chamber into the chamber, and then the chemical liquid is supplied continuously. Therefore the semiconductor workpiece can uniformly be processed for etching and the like.

Since the present invention regulates the temperature and/or the concentration of the processing chemical liquid or pure water to be supplied into the chamber, cleaning efficiency is enhanced.

Since the semiconductor workpiece cleaning apparatus of the present invention recovers the chemical liquid discharged from the chamber and returns the same into the chamber after cleaning, the chemical liquid can be recycled, the cleaning cost can be reduced, and the effluence of the waste chemical liquid is reduced.

Furthermore, since efficient megasonic oscillation is used for cleaning, cleaning effect can effectively be enhanced without increasing the cost.

Obviously, numerous additional modifications and variations of the present invention are possible in light of the above teachings. It is therefore to be understood that within the scope of the appended claims, the invention may be practiced otherwise than as specifically described herein.

What is claimed is:

1. A semiconductor workpiece cleaning apparatus comprising:
    a chamber for processing a semiconductor workpiece;
    a support apparatus for supporting the semiconductor workpiece in said chamber;
    a cleaning apparatus for cleaning the semiconductor workpiece in said chamber by spraying said semiconductor workpiece first with a processing chemical liquid and secondly with pure water in said chamber, and then by immersing the semiconductor workpiece firstly in a second processing chemical liquid and secondly in pure water in said chamber;
    a charging apparatus for bringing a drying chemical into contact with said pure water in which the semiconductor workpiece is immersed, said drying chemical being in at least one of a liquid form and a vapor form, said drying chemical and said at least one of said processing chemical liquid and pure water forming an interface therebetween; and
    a discharging apparatus for discharging said at least one of said processing chemical liquid and pure water from said chamber while preserving said interface during discharge.

2. The semiconductor workpiece cleaning apparatus according to claim 1, wherein said cleaning means comprises:
    a spraying means for spraying said at least one of said processing chemical liquid and pure water on said semiconductor workpiece so as to clean the semiconductor workpiece; and
    immersion means for supplying another processing chemical liquid into said chamber so as to immerse the semiconductor workpiece therein.

3. The semiconductor workpiece cleaning apparatus according to claim 1, wherein said charging means comprises means for charging said chamber with said at least one of said processing chemical liquid and pure water through a lower part of said chamber; and
    said discharging means discharges said at least one of said process chemical liquid and pure water from said chamber through the lower part of said chamber.

4. The semiconductor workpiece cleaning apparatus according to claim 3, further comprising means for inverting said semiconductor workpiece when a lower half of the semiconductor workpiece is immersed in said processing chemical liquid while said processing chemical liquid is being supplied into said chamber, and said processing chemical liquid is further supplied into said chamber.

5. The semiconductor workpiece cleaning apparatus according to claim 1, wherein said drying means supplies said drying chemical liquid through an upper part of said chamber, and said drying chemical liquid forms a boundary layer which separates an upper gas phase from a lower liquid phase when said drying chemical liquid at least one contacts with and dissolves in said at least one of said processing chemical liquid and pure water.

6. The semiconductor workpiece cleaning apparatus according to claim 1, wherein said drying means supplies said drying chemical vapor through an upper part of said chamber so that said drying chemical vapor at least one dissolves and condenses in a surface layer of said at least one of said processing chemical liquid and pure water to form a blocking boundary layer in said at least one of said processing chemical liquid and pure water.

7. The semiconductor workpiece cleaning apparatus according to claim 1, wherein said drying means supplies said drying chemical liquid into said chamber through a lower part of said chamber to replace said at least one of said processing chemical liquid and pure water in which the semiconductor workpiece is immersed with said drying chemical liquid.

8. The semiconductor workpiece cleaning apparatus according to claim 1, wherein said cleaning means cleans said semiconductor workpiece with said processing chemical liquid that is selected from a group of mixed liquid prepared by mixing ammonia, hydrogen peroxide and water; hydrochloric acid, hydrogen peroxide and water; sulfuric acid, hydrogen peroxide and water; hydrofluoric acid and water; hydrofluoric acid, hydrogen peroxide and water; hydrofluoric acid, ammonium fluoride and water; ozone and water; and electrolytic ionic water.

9. The semiconductor workpiece cleaning apparatus according to claim 1, wherein said cleaning means is for removing an oxide film from said semiconductor workpiece with said processing chemical liquid that is selected from a group of mixed liquid prepared by mixing hydrofluoric acid and water; hydrofluoric acid, hydrogen peroxide and water; and hydrofluoric acid, ammonium fluoride and water.

10. The semiconductor workpiece cleaning apparatus according to claim 1, wherein said drying means drys said semiconductor workpiece with said drying chemical liquid that is either isopropyl alcohol or florinat.

11. The semiconductor workpiece cleaning apparatus according to claim 1, wherein the chamber is provided with at least one nozzle for spraying said at least one processing chemical liquid and pure water.

12. The semiconductor workpiece cleaning apparatus according to claim 11, wherein a spraying direction of said at least one nozzle is varied while spraying said at least one processing chemical liquid and pure water.

13. The semiconductor workpiece cleaning apparatus according to claim 12, further comprising means for turning the semiconductor workpiece within said chamber while said at least one of said processing chemical liquid and pure water is sprayed.

14. The semiconductor workpiece cleaning apparatus according to claim 13, wherein said cleaning means sequentially sprays a combination of different processing chemical liquids, and water on the workpiece through the at least one nozzle within said chamber.

15. The semiconductor workpiece cleaning apparatus according to claim 1, further comprising at least one of a means for heating said at least one of a processing chemical liquid and pure water to be supplied into said chamber at a predetermined temperature and a means for regulating a concentration of said processing chemical liquid.

16. The semiconductor workpiece cleaning apparatus according to claim 1, further comprising a temperature regulating means for regulating a temperature of an interior of said chamber.

17. The semiconductor workpiece cleaning apparatus according to claim 1, further comprising a returning means for recovering said at least one of said processing chemical liquid and water discharged from said chamber and returning the same to said chamber.

18. The semiconductor workpiece cleaning apparatus according to claim 1, further comprising a megasonic oscillation means for creating oscillations in said chamber.

19. The semiconductor workpiece cleaning apparatus according to claim 18, wherein the megasonic oscillation means is disposed at a portion of said chamber, and said apparatus comprises means for turning the semiconductor workpiece so as to exert a megasonic effect entirely over said semiconductor workpiece.

* * * * *